US007330065B2

(12) United States Patent
Simonson

(10) Patent No.: US 7,330,065 B2
(45) Date of Patent: Feb. 12, 2008

(54) INRUSH CURRENT SLEW CONTROL CIRCUIT AND METHOD

(75) Inventor: Joshua John Simonson, Freemont, CA (US)

(73) Assignee: Linear Technology Corporation, Milpitas, CA (US)

( * ) Notice: Subject to any disclaimer, the term of this patent is extended or adjusted under 35 U.S.C. 154(b) by 11 days.

(21) Appl. No.: 10/966,101

(22) Filed: Oct. 18, 2004

(65) Prior Publication Data

US 2006/0082407 A1    Apr. 20, 2006

(51) Int. Cl.
*H03K 17/687* (2006.01)
(52) U.S. Cl. ........................ 327/427; 327/434; 327/437
(58) Field of Classification Search ...................... None
See application file for complete search history.

(56) References Cited

U.S. PATENT DOCUMENTS 5,488,322 A * 1/1996 Kaplinsky .................... 327/74
6,545,513 B2 * 4/2003 Tsuchida et al. ............. 327/108
6,680,837 B1 * 1/2004 Buxton ........................ 361/93.9
2006/0044070 A1 * 3/2006 Fujita ........................... 330/308

* cited by examiner

*Primary Examiner*—Tuan T. Lam
*Assistant Examiner*—Hiep Nguyen
(74) *Attorney, Agent, or Firm*—McDermott Will & Emery LLP

(57) ABSTRACT

Circuitry and methodology for controlling a FET or another transistor device provided to supply power to a circuit board insertable into a live backplane to provide inrush current slew rate control. The FET control circuit is responsive to an input signal variable in a preset manner to produce a FET control signal for controlling the FET so as to form an output signal corresponding to the input signal. The control circuit is configured to prevent the uncontrollable step in the output from being produced when the FET control signal reaches a level sufficient to control the FET. In one embodiment, a comparator is provided for comparing the FET control signal with a reference value that may correspond to a current for charging a control terminal of the FET to prevent the input signal from changing until the FET control signal exceeds the reference value.

30 Claims, 2 Drawing Sheets

(BACKGROUND INFORMATION)

(BACKGROUND INFORMATION)

(BACKGROUND INFORMATION)

(BACKGROUND INFORMATION)

INRUSH CURRENT SLEW CONTROL CIRCUIT AND METHOD

TECHNICAL FIELD

This disclosure relates to power supply systems, and more particularly, to circuitry and methodology for controlling a circuit for switching power, in which the slew rate of inrush current is limited. The subject matter of the disclosure has applicability, but not limitation to systems in which circuit boards are safely inserted to and removed from a live backplane.

BACKGROUND ART

High-availability systems typically have multiple boards or cards arranged in parallel slots in a chassis or backplane. With this type of scheme, boards or cards may be removed from, and inserted into a live backplane at will. A board may have a large capacitance, and the backplane may have some inductance between the power supply and the board connector. Fast changes in current through a switch between the board and the backplane to charge a large capacitive load may cause a power droop or ringing on the backplane due to the fast change in current though the backplane inductance. This can result in undervoltage and overvoltage conditions in the boards, cards or chips on the backplane power supply line.

Each plug-in module usually has a local Hot Swap™ controller, ensuring that power is safely applied to that board during both rigorous hot-swap events, and steady-state conditions. The Hot Swap™ controller allows a board to be safely inserted to and removed from a live backplane. The Hot Swap™ controller must protect against large inrush currents, over-voltage and under-voltage faults, and backplane voltage transients. An example is the LTC4214 device produced by the Linear Technology Corporation, the assignee of the current subject matter.

When circuit boards are inserted into a live backplane, power supply bypass capacitors can draw a large transient current or inrush current from the power bus as they charge. The primary function of a Hot Swap™ controller is to limit this inrush current to acceptable levels, allowing an operator to insert boards quickly and easily without having to power-down the system. Without this orderly application of load current, the board and connectors could be severely damaged and the backplane voltage may be pulled down or ring.

If a current fault, such as a short-circuit condition, occurs on a board after start-up, the controller should isolate the board from the supply, ensuring that the other boards in the rack are kept operational, and that a single faulty board will not pull the backplane voltage down, causing system-wide failures. In high-availability applications, where uptime is critical, the controller should permanently disconnect the board only when the current fault is permanent. Board shutdown due to transient current faults should be avoided, but every effort should be made to keep the board safe while assessing the seriousness of an over-current fault.

A properly set inrush current profile that limits the current slew rate, i.e. the change in current over time (dI/dt), guarantees that the current in the supply inductance changes slowly enough that supply droop and ringing are not problematic for a capacitive load of any value. Hence, there is a need in circuitry to limit the slew rate of the inrush current in circuits that switch power between a backplane and a daughter board or card, to prevent glitches on the backplane power supply that can influence circuits resident on the backplane.

SUMMARY OF THE DISCLOSURE

The present disclosure offers novel circuitry and methodology for controlling a field-effect transistor (FET) or other transistor device provided to supply power to a circuit board insertable into a live backplane, to provide inrush current slew rate control. The FET control circuit of the present disclosure comprises control circuitry responsive to an input signal to produce a FET control signal for controlling the FET so as to form an output signal variable in accordance with the input signal. The control circuitry is configured to prevent the uncontrollable step in the output from being produced when the FET control signal reaches a level sufficient to control the FET, as may occur upon a startup. In one embodiment, the control circuitry includes a comparator for comparing the FET control signal with a reference value that may correspond to a current for charging a control terminal of the FET to prevent the input signal from changing until the FET control signal exceeds the reference value, indicating that the FET may be controlled. The comparator may slow down the input signal or modify its behavior in a prescribed manner when the FET control signal is at or less than the reference value.

In accordance with one aspect of the disclosure, the comparator may compare a FET control signal produced by the control circuitry with a reference current which is related to a current for charging a control terminal of the FET. If the FET control current is at a or less than the reference current, the comparator may produce a disabling signal to prevent the input signal to the control circuitry from moving. When the FET control current exceeds the reference current, the comparator produces an enabling signal for resuming movement of the input signal.

In accordance with an embodiment of the disclosure, the FET may include a field-effect transistor controlled by an amplifier that produces an output in response to a ramp voltage applied to one of its inputs. Another input of the amplifier is supplied with a sense voltage that corresponds to the current through the FET such that the control signal forces the sense voltage to follow the ramp voltage, in order to control an inrush current slew rate. The comparator may compare a current mirrored with respect to the control current with the reference current to control an input control circuit provided for controlling movement of the input signal. The amplifier may be a transconductance amplifier.

In accordance with another aspect of the disclosure, the amplifier produces the output current for controlling the gate of the field-effect transistor. The comparator may determine whether or not the control current produced by the amplifier is sufficient to indicate that the gate of the field-effect transistor is actively being controlled to produce the sense voltage that follows the ramp voltage.

Additional advantages and aspects of the disclosure will become readily apparent to those skilled in the art from the following detailed description, wherein embodiments of the present disclosure are shown and described, simply by way of illustration of the best mode contemplated for practicing the present disclosure. As will be described, the disclosure is capable of other and different embodiments, and its several details are susceptible of modification in various obvious respects, all without departing from the spirit of the disclosure. Accordingly, the drawings and description are to be regarded as illustrative in nature, and not as limitative.

BRIEF DESCRIPTION OF THE DRAWINGS

The following detailed description of the embodiments of the present disclosure can best be understood when read in conjunction with the following drawings, in which the features are not necessarily drawn to scale but rather are drawn as to best illustrate the pertinent features, wherein.

DETAILED DISCLOSURE OF THE EMBODIMENTS

The present disclosure will be made with the example of controlling a FET for turning on a board power supply. It will become apparent, however, that the concepts described herein are applicable to controlling a slew rate of an input current in any power supply application using various types of FET, or other transistor devices.

Figure 1:
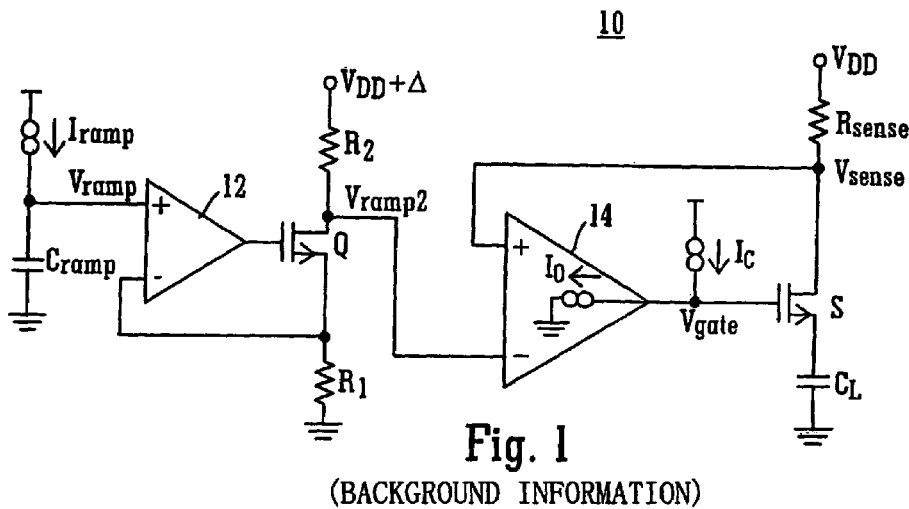
FIG. 1 is a circuit for limiting an inrush current slew rate.

FIG. 1 illustrates a circuit 10 for controlling a MOSFET switch S that may be provided on a circuit board insertable into a live backplane for supplying the circuit board with power from the backplane. As described in more detail below, the circuit 10 limits inrush currents by forcing the MOSFET current to follow in proportion to a pre-set voltage ramp.

In particular, the circuit 10 comprises a ramp generator composed of a current source Iramp and a capacitor Cramp. The current source Iramp drives current into the capacitor Cramp to produce ramp voltage Vramp supplied to a non-inverting input of an operational amplifier 12. The value of the capacitor Cramp is determined for a particular application to achieve an appropriate slope of the voltage ramp, which is determined based on a corresponding inrush current slew rate (dI/dt) acceptable for that particular application. For example, the capacitor Cramp may have a capacitance of 68 nF.

Figure 2:
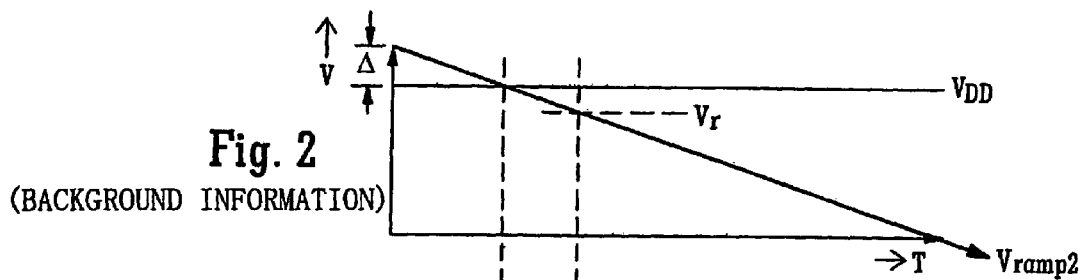
FIG. 2 is a timing diagram illustrating a ramp voltage produced in the circuit shown in FIG. 1.

The operational amplifier 12 causes a voltage proportional to the ramp voltage referenced to ground to be replicated below commanded voltage $V_{DD}+\Delta$. The output of the amplifier 12 drives the gate of an N-type field-effect transistor Q to produce ramp voltage Vramp2 at its drain. While the voltage Vramp ramps linearly from zero and has a positive slope, the voltage Vramp2 starts at commanded voltage $V_{DD}+\Delta$ provided at the drain of the transistor Q and has a negative slope due to inversion by transistor Q. The ratio between the slopes of Vramp and Vramp2 is determined by the ratio between resistors R1 and R2 connected to the source and drain terminals of transistor Q1. FIG. 2 is a timing diagram illustrating the voltage Vramp2 that ramps linearly from voltage $V_{DD}+\Delta$ to zero.

The voltage Vramp2 is supplied to an inverting input of a transconductance amplifier 14 that produces output current Io for controlling the gate of the MOSFET switch S. The gate is also controlled by pull-up or charging current Ic provided by a charge pump for charging the gate of the MOSFET switch S and associated load capacitance $C_L$. The MOSFET load current determines current sense voltage Vsense on resistor Rsense coupled to the drain terminal of the MOSFET. The sense voltage Vsense is supplied to the non-inverting input of the transconductance amplifier 14. As the output current Io of the transconductance amplifier 14 corresponds to the difference between the voltages at its inputs, the transconductance amplifier 14 forces the voltage Vsense to follow the value of the voltage Vramp2. Hence, the MOSFET load current is forced to vary in a manner defined by the voltage Vramp2 in order to control the inrush current.

Figure 3:
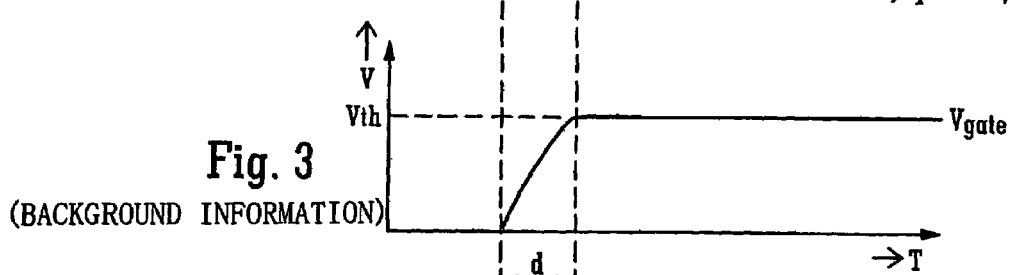
FIG. 3 is a timing diagram illustrating a gate voltage produced in the circuit shown in FIG. 1.
Figure 4:
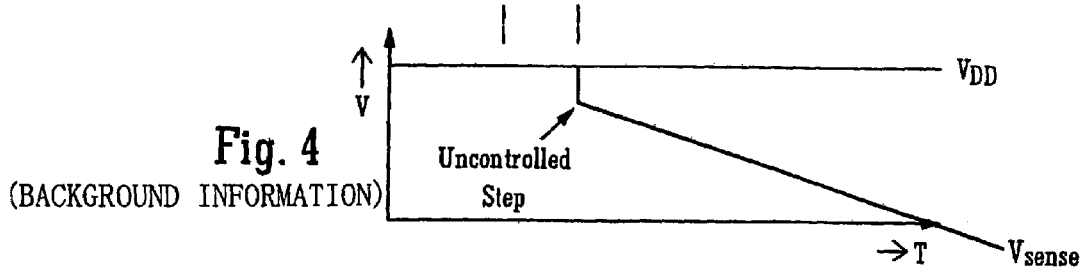
FIG. 4 is a timing diagram illustrating a sense voltage produced in the circuit shown in FIG. 1.

As illustrated in FIG. 3, voltage Vgate formed at the gate of the MOSFET switch S starts to rise above ground when the linearly decreasing voltage Vramp2 reaches the $V_{DD}$ value. However, because the charging current Ic used as a pull-up current is limited, the gate voltage Vgate reaches the level of the MOSFET threshold voltage Vth to turn on the MOSFET switch S only after a delay time d. During this delay time, the voltage Vramp2 has dropped to a level Vr lower than the Vdd level. As a result, when the MOSFET switch S is turned on after the delay time d, the value of the voltage Vsense following the value of the voltage Vramp 2 almost immediately jumps from the level defined by the drain voltage $V_{DD}$ to the Vr level (FIG. 4). This uncontrolled step in the voltage Vsense may result in an initial current slew rate (dI/dt) greater than intended.

The delay time d required to bring the MOSFET gate to the threshold voltage is equal to $C_{gate} \times (Vth/Ic)$, where $C_{gate}$ is the capacitance of the gate, Vth is the threshold voltage, and the Ic is the pull-up or charging current. For a typical MOSFET with a gate capacitance of 10 nF, threshold voltage of 2V and a pull-up current of 20 μA, the gate takes 1 ms to slew to the threshold level. In a 5 A power supply system with a dI/dt limit of 1 A/ms, the current will rise to 1 A during a short period at the end of delay time d, resulting in an uncontrolled step in the inrush current from 0 to 1 A. Hence, the uncontrolled step may reach up to 20% of the maximum allowed current. Such a step may cause backplane glitches.

Figure 5:
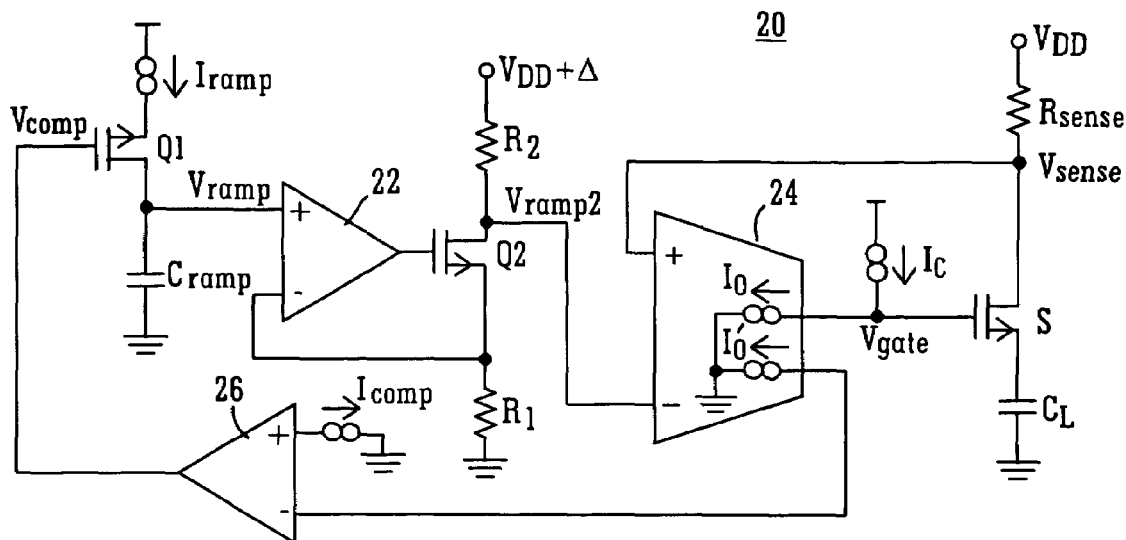
FIG. 5 is a circuit that prevents the inrush current slew rate from being increased due to a step-wise change in the sense voltage.

FIG. 5 shows a control circuit 20 capable of eliminating the uncontrolled step in the inrush current. Similar to the control circuit 10 in FIG. 1, the control circuit 20 may control a MOSFET switch S that may be provided on a circuit board insertable into a live backplane for supplying the circuit board with power from the backplane.

The control circuit 20 comprises a ramp generator composed of a current source Iramp and a capacitor Cramp connected to the drain terminal of a field-effect transistor Q1 that serves as a current-limit amplifier. The gate of the transistor Q1 is controlled to enable or disable producing ramp voltage Vramp based on the current Iramp. When the field-effect transistor Q1 is turned on, the current source Iramp is enabled to drive current into the capacitor Cramp to produce ramp voltage Vramp starting at zero and having a positive slope. The value of the capacitor Cramp is determined for a particular application to achieve an appropriate slope of the voltage ramp, which is determined based on the corresponding inrush current slew rate (dI/dt) acceptable for that particular application. For example, the capacitor Cramp may have a capacitance of 68 nF.

The voltage Vramp is supplied to the non-inverting input of an operational amplifier 22, which drives the gate of a field-effect transistor Q2 to produce ramp voltage Vramp2 (FIG. 6) that starts at commanded voltage value $V_{DD}+\Delta$ provided at the drain of the transistor Q2 and has a negative slope. The ratio between the slopes of Vramp and Vramp2 is determined by the ratio between resistors R1 and R2 connected to source and drain terminals of the transistor Q2.

The ramp voltage Vramp2 is supplied to an inverting input of a transconductance amplifier 24 that produces output current Io for pulling down voltage Vgate at the gate of the MOSFET switch S. Charging current Ic is produced by a charge pump for charging the gate of the MOSFET switch S and associated load capacitance $C_L$ to pull up the gate. The charging current value may be set based on capabilities of the charge pump. For example, a charging current of 20 µA may be set. The current sense voltage Vsense produced at resistor Rsense in accordance with the load current is supplied to a non-inverting input of the transconductance amplifier 24 to produce the output current Io that forces the sense voltage Vsense to follow the ramp voltage Vramp2.

Current Io' mirrored with respect to the current Io is supplied to an inverting input of a current comparator 26 that compares this current with reference current Icomp supplied to its non-inverting input. The reference current Icomp is selected based on the charging current Ic. For example, the reference current may be set at 10% of the charging current.

The current comparator 26 checks whether or not the output current of the transconductance amplifier 24 is pulling down against the charging current, i.e. whether or not the transconductance amplifier 24 is able to control the gate of the MOSFET switch S to produce the sense voltage Vsense that follows the ramp voltage Vramp2.

At the beginning of the ramp, the Vramp2 input to the transconductance amplifier 24 commands a voltage on the sense resistor Rsense that corresponds to a negative current because the ramp voltage Vramp2 is less than the current sense voltage. The transconductance amplifier 24 draws the gate below the threshold of MOSFET switch S and sinks the charging current. The current comparator 26 determines that the transconductance current Io is greater than the reference current Icomp which is less than the charging current, and outputs a logic "0" which maintains the transistor Q1 in an on-state to allow the ramp voltage Vramp to keep rising.

Figure 6:
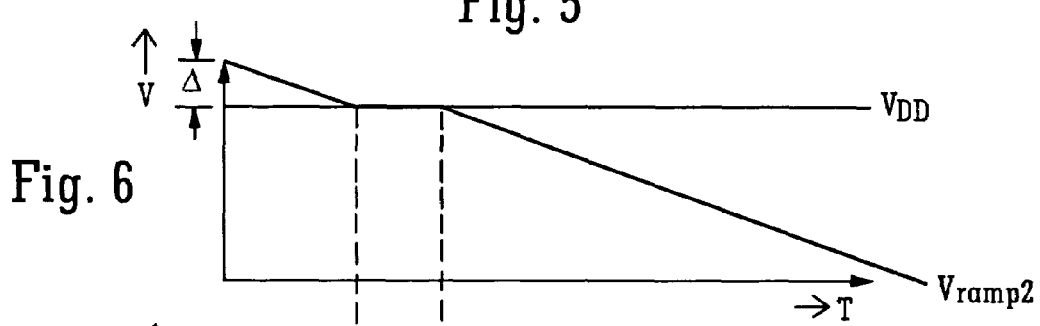
FIG. 6 is a timing diagram illustrating a ramp voltage produced in the circuit shown in FIG. 5.
Figure 7:
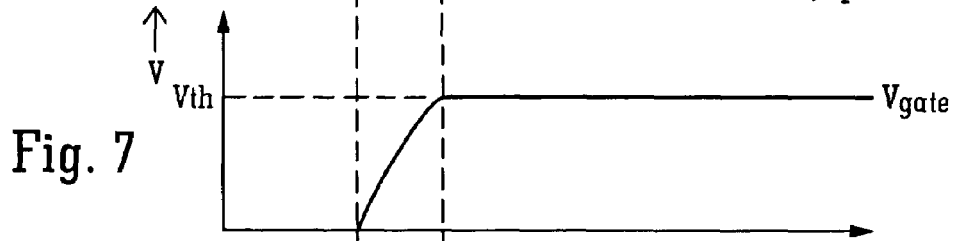
FIG. 7 is a timing diagram illustrating a gate voltage produced in the circuit shown in FIG. 5.
Figure 9:
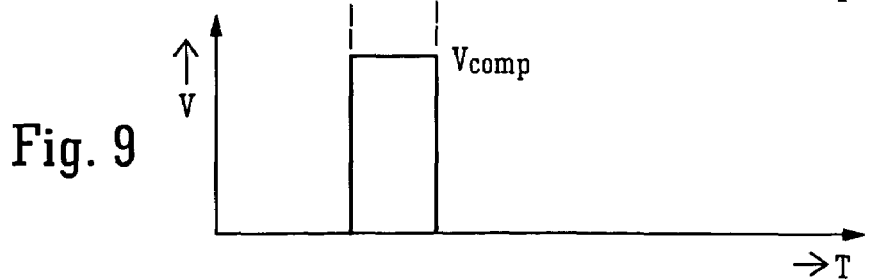
FIG. 9 is a timing diagram illustrating an output of a current comparator.

When the ramp voltage Vramp reaches the point that corresponds to a zero value of the current sense voltage Vsense, the transconductance amplifier 24 stops drawing the charging current off the gate node and allows the gate to rise and the MOSFET switch S to begin to turn on. As shown in FIG. 6, at this point, the ramp voltage Vramp has reached the $V_{DD}$ level. If the transconductance amplifier 24 does not pull down the gate, it allows the gate to slew upward, as shown in FIG. 7. In this case, the current $Io_1$ becomes less than the reference current Icomp. In response to this condition, the current comparator 26 produces a logic "1" at its output (FIG. 9) to turn off the transistor Q1 that controls the ramp generator. When the transistor Q1 is off, the ramp generator keeps the ramp voltage Vramp at a value near zero. Accordingly, when the voltage Vramp2 reaches the $V_{DD}$ level, it stays at this level until the transistor Q1 is turned on.

Figure 8:
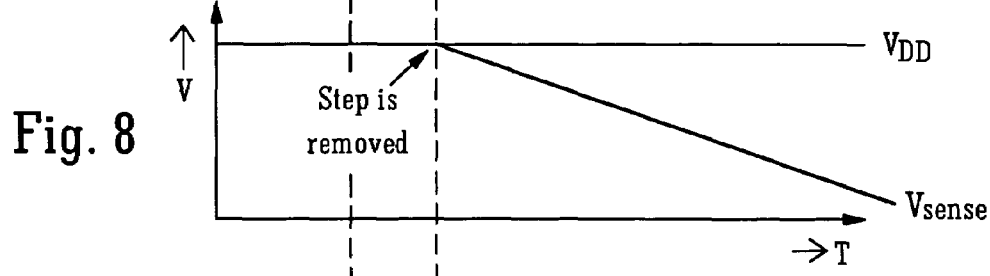
FIG. 8 is a timing diagram illustrating a sense voltage produced in the circuit shown in FIG. 5.

While the ramp voltage Vramp is held at a value near zero, the constant charging current Ic charges the gate increasing the gate voltage. When the gate voltage Vgate reaches the threshold level Vth in FIG. 7, the load current exceeds the commanded current corresponding to the ramp voltage Vramp2, and the transconductance amplifier 24 resumes drawing some of the charging current Ic as it regulates the sense voltage. When the transconductance amplifier pulls against the charging current Ic to regulate the sense current, the current Io' exceeds the reference current Icomp. In response to this condition, the current comparator 26 produces logic "0" at its output to turn on the transistor Q1, which enables the ramp generator to resume producing the ramp voltage Vramp. The ramp voltage Vramp2 resumes decreasing from the $V_{DD}$ level in accordance with the ramp voltage Vramp. Therefore, as shown in FIG. 8, the sense voltage Vsense follows the ramp voltage Vramp2 linearly as it reduces from the Vdd level to limit the inrush current slew rate.

Hence, the control circuit 20 eliminates the uncontrolled step in the sense voltage Vsense caused by reducing the ramp voltage Vramp2 with respect to the $V_{DD}$ level. As a result, the circuit 20 prevents the inrush current slew rate from being increased due to the delay in slewing the gate of MOSFET switch S to the threshold voltage Vth.

The foregoing description illustrates and describes aspects of the present invention. Additionally, the disclosure shows and describes only preferred embodiments, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. For example, the invention may be implemented in a multi-channel power supply system using a single ramp generator prevented from producing a change in the ramp voltage when any of the channels are slewing, or the current through the switch may be measured by some other means than a sense resistor.

The embodiments described hereinabove are further intended to explain best modes known of practicing the invention and to enable others skilled in the art to utilize the invention in such, or other, embodiments and with the various modifications required by the particular applications or uses of the invention.

Accordingly, the description is not intended to limit the invention to the form disclosed herein. Also, it is intended that the appended claims be construed to include alternative embodiments.

What is claimed is:

1. A system for limiting a slew rate of inrush current associated with a field-effect transistor (FET) in which a gate voltage applied to the FET reaches a threshold voltage of the FET after a delay period that tends to cause an uncontrollable step in a FET output signal at a startup, wherein the system includes:
   control circuitry responsive to an input signal for producing a FET control signal for controlling the FET, and
   a circuit configured to inhibit the input signal during the delay period to prevent the uncontrollable step in the FET output signal from being produced.

2. A method of controlling a FET having a gate threshold voltage beneath which the FET is uncontrollable, wherein a gate voltage applied to the FET reaches the gate threshold voltage after a delay period that tends to cause an uncontrollable step in a FET output signal, the method comprising the steps of:
   producing a FET control signal responsive to a variable input signal for controlling the FET so as to cause an output voltage of the FET to vary in accordance with the variable input signal, and
   comparing the FET control signal with a reference value to maintain the variable input signal at a predetermined level during the delay period until the gate voltage reaches a threshold voltage level, in order to prevent the uncontrollable step in the FET output signal from being produced FET.

3. A system for limiting a slew rate of inrush current associated with a FET, in which the FET has a gate threshold voltage beneath which the FET is uncontrollable, and in which a gate voltage applied to the FET reaches the gate threshold voltage after a delay period that tends to cause an uncontrollable step in a FET output signal, wherein the system includes:
control circuitry responsive to an input signal for producing a FET control signal for controlling the FET, and
a determining circuit configured to determine whether or not the FET control signal is sufficient to control the FET, and in response, inhibiting the input signal during the delay period until the gate voltage reaches the gate threshold voltage to prevent the uncontrollable step in the FET output signal from being produced.

4. The system of claim 3, wherein the determining circuit is configured for comparing the FET control signal with a reference value to maintain the input signal at a predetermined level until the FET control signal exceeds the reference value indicating that the FET control signal is sufficient to control the FET.

5. The system of claim 3, wherein the determining circuit is configured for comparing the FET control signal with a reference value to modify the behavior of the input signal until the FET control signal exceeds the reference value indicating that the FET control signal is sufficient to control the FET.

6. The system of claim 3, wherein the determining circuit is configured for comparing a value corresponding to a control voltage for controlling the FET with a value corresponding to a threshold that indicates that the FET is being controlled.

7. The system of claim 3, wherein the determining circuit is configured for comparing a control current produced by an intermediate stage of the control circuitry with a reference current that corresponds to a current in a next stage of the control circuitry.

8. The system of claim 6, wherein the reference value corresponds to a current for charging a control terminal of the FET.

9. The system of claim 3, wherein the determining circuit is configured for comparing a control current for controlling the FET with a current corresponding to a current for charging a control terminal of the FET.

10. A system for controlling a FET having a gate threshold voltage beneath which the FET is uncontrollable, wherein a gate voltage applied to the FET reaches the gate threshold voltage after a delay period that tends to cause an uncontrollable step in a FET output signal, the system comprising:
control circuitry responsive to an input signal for controlling the FET so as to form an output signal variable in accordance with the input signal, the control circuitry including a comparator for comparing the FET control signal with a reference value, and operative to maintain the input signal at a predetermined level during the delay period until the gate voltage reaches the gate threshold voltage, in order to prevent the uncontrollable step in the FET output signal from being produced.

11. The system of claim 10, wherein the reference value corresponds to a current for charging a control terminal of the FET.

12. The system of claim 10, wherein the comparator is configured for comparing a control current for controlling the FET with the reference value.

13. The system of claim 10, wherein the comparator is configured for comparing a control current for controlling the FET with a current corresponding to a current for charging a control terminal of the FET.

14. The system of claim 10, wherein the comparator is configured for generating a control voltage for controlling behavior of the input signal.

15. The system of claim 10, wherein the control circuitry is configured for producing a control current.

16. The system of claim 15, wherein the control circuitry is configured for producing a mirror current mirrored with respect to the control current.

17. The system of claim 16, wherein the comparator is configured for comparing the mirror current with the reference value.

18. The system of claim 10, wherein the control circuitry includes a transconductance amplifier for producing a control current to control the FET.

19. The system of claim 10, further comprising an input control circuit for controlling behavior of the input signal.

20. The system of claim 19, wherein the comparator is configured for producing a comparison signal for disabling the input control circuit when the FET control signal is less than the reference value.

21. The system of claim 10, wherein the comparator is configured for producing a comparison signal for maintaining the input signal at the predetermined level when the FET control signal is less than the reference value.

22. The system of claim 10, further comprising input circuitry responsive to the input signal for producing a control signal for controlling the control circuitry.

23. The system of claim 10, wherein the input signal includes a ramp-type signal.

24. A method of controlling a FET having a gate threshold voltage beneath which the FET is uncontrollable, wherein a gate voltage applied to the FET reaches the gate threshold voltage after a delay period that tends to cause an uncontrollable step in a FET output signal, the method comprising the steps of:
producing a FET control signal responsive to an input signal for controlling the FET so as to form an output signal variable in accordance with the input signal, and
comparing the FET control signal with a reference value to prevent the input signal from being changed during the delay period until the FET control signal exceeds the reference value, indicating that the gate voltage reaches the threshold voltage.

25. The method of claim 24, wherein the reference value corresponds to a current for charging a control terminal of the FET.

26. The method of claim 24, wherein the step of comparing includes comparing a control current for controlling the FET with the reference value.

27. The method of claim 24, wherein the step of comparing includes comparing a control value corresponding to a control voltage for controlling the FET with the reference value.

28. A system for limiting a slew rate of inrush current caused by operation of a FET having a gate threshold voltage beneath which the FET is uncontrollable, and in which a gate voltage applied to the FET reaches the gate threshold voltage after a delay period that tends to cause an uncontrollable step in a FET output signal wherein at a startup, the system comprising:
a ramp generator for producing a ramp signal,
an operational amplifier having a first input responsive to the ramp signal for producing a FET control signal for controlling the FET to form a signal at an output of the FET, and having a second input responsive to an output signal of the operational amplifier to force the output signal to vary in accordance with the ramp signal, and a comparator for comparing the FET control signal with a reference value correspondent to control the ramp generator so as to inhibit incrementing the ramp signal during the delay period, to prevent the uncontrollable step in the FET output signal from being produced.

29. A system for controlling a FET, in which a gate voltage applied to the FET reaches a threshold voltage of the FET after a delay period that tends to cause an uncontrollable step in a FET output signal at a startup, the system comprising control circuitry responsive to an input signal to produce a FET control signal for controlling the FET so as to form an output signal variable in accordance with the input signal, the control circuitry including a circuit for determining whether or not the FET control signal is sufficient to control the FET during the delay period, and operative to modify the input signal when the FET control signal is not sufficient, to prevent the uncontrolled step from being produced.

30. A method of controlling a FET having a gate threshold voltage beneath which the FET is uncontrollable, wherein a gate voltage applied to the FET reaches the gate threshold voltage after a delay period that tends to cause an uncontrollable step in a FET output signal, the method comprising the steps of:

producing a FET control signal responsive to an input signal variable in a prescribed manner for controlling the FET so as to form an output signal variable in accordance with the input signal, and comparing a signal that is used to generate the FET control signal with a reference value to prevent the input signal from being changed during the delay period until the signal that is used to generate the control signal has a prescribed value indicating that the gate voltage reaches the threshold voltage level.

* * * * *